(12) United States Patent
Kim (10) Patent No.: US 6,246,015 B1
(45) Date of Patent: Jun. 12, 2001

(54) PRINTED CIRCUIT BOARD FOR BALL GRID ARRAY SEMICONDUCTOR PACKAGES

(75) Inventor: Sung Jin Kim, Seoul (KR)

(73) Assignees: Anam Semiconductor, Inc., Seoul (KR); Amkor Technology Inc., Chandler, AZ (US)

( * ) Notice: Subject to any disclaimer, the term of this patent is extended or adjusted under 35 U.S.C. 154(b) by 0 days.

(21) Appl. No.: 09/240,422

(22) Filed: Jan. 29, 1999

(30) Foreign Application Priority Data

| May 27, 1998 | (KR) | 98-19304 |
| Sep. 8, 1998 | (KR) | 98-36897 |
| Sep. 8, 1998 | (KR) | 98-36898 |

(51) Int. Cl.[7] .............................. H01R 12/04; H05K 1/11
(52) U.S. Cl. ......................... 174/261; 174/255; 174/260
(58) Field of Search .................. 174/260, 52.2, 174/255, 261; 257/734, 678, 690; 361/767, 777, 783

(56) References Cited

U.S. PATENT DOCUMENTS

| 5,635,671 | 6/1997 | Freyman et al. | 174/52.2 |
| 5,801,440 | * 9/1998 | Chu et al. | 257/691 |
| 6,150,193 | * 11/2000 | Glenn | 438/113 |

* cited by examiner

Primary Examiner—Albert W. Paladini
Assistant Examiner—Jeremy Norris
(74) Attorney, Agent, or Firm—Skjerven Morrill MacPherson LLP; Don C. Lawrence (57) ABSTRACT

A printed circuit board for BGA semiconductor packages has structure for effectively grounding the PCB to a grounded mold during molding of the package, thus preventing any accumulation of electrostatic charge on the package, and hence, any damage to the semiconductor chips, bonding wires or conductive traces in the packages caused by a rapid discharge of such an accumulated charge. The grounding means may comprise a flat grounding pad, a raised grounding boss, and/or a plated-through, grounding tooling hole on the board. The grounding pad or boss is electrically connected to a ground via hole and/or a ground trace on the board, and is located outside of a package separation line formed on a surface of the PCB. The grounding tooling hole is internally plated with a conductive metal layer to make electrical contact with conductive tooling pins that extend between the molds.

19 Claims, 7 Drawing Sheets

PRINTED CIRCUIT BOARD FOR BALL GRID ARRAY SEMICONDUCTOR PACKAGES

BACKGROUND OF THE INVENTION

1. Field of the Invention

The present invention relates, in general, to semiconductor packaging, and more particularly, to a printed circuit board for use in a ball grid array semiconductor package that prevents the accumulation of an electrostatic charge in the package during molding, thereby preventing damage to the components in the package caused by a rapid discharge of such an electrostatic charge.

2. Description of the Related Art

The recent trend in consumer electronics has been toward smaller, lighter products having improved capabilities and capacities, which has, in turn, resulted in a demand for semiconductor chips that are smaller, more highly integrated, and of higher capacity. Accordingly, modem semiconductor packages must have excellent electrical characteristics, high heat dissipating capabilities, and a large input/output-terminal capacity, to enable such small, highly integrated, and efficient semiconductor chips to perform as expected.

Ball grid array (BGA) semiconductor packages have been proposed and widely used as an exemplary package capable of enabling small, efficient and highly integrated semiconductor chips to meet their design goals effectively. Such BGA packages are easily formed on a conventional printed circuit board (PCB) and can effectively reduce the overall length of electric circuits incorporating them. BGA packages also utilize power- and/or ground-bonding areas more effectively, thus yielding excellent electric characteristics. Also, the input/output terminal density of BGA packages is greater than that of conventional quad flat packages (QFPs), which better comports with the trend toward smaller, denser packages.

Figure 8A:
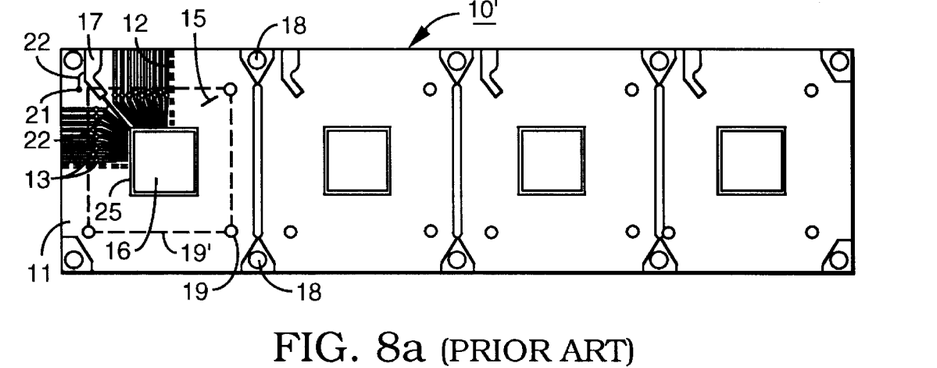
FIGS. 8a and 8b are top and bottom plan views, respectively, of a conventional PCB for typical BGA semiconductor packages.
Figure 8B:
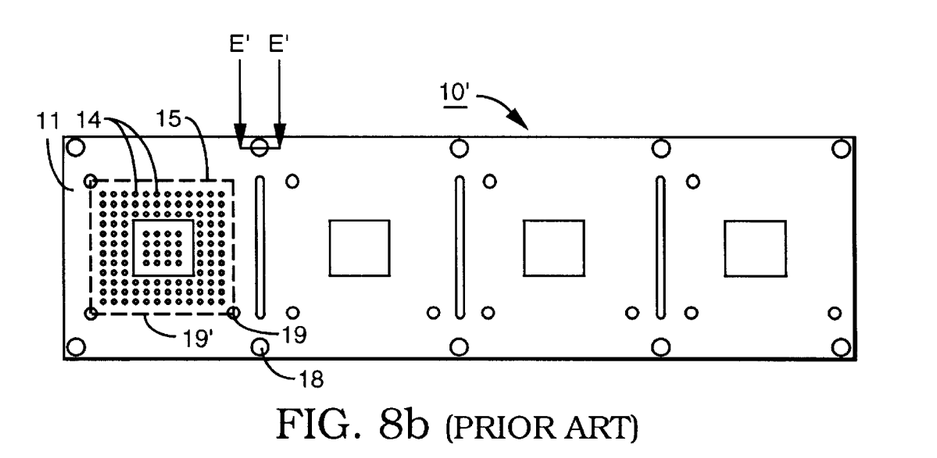
Figure 9:
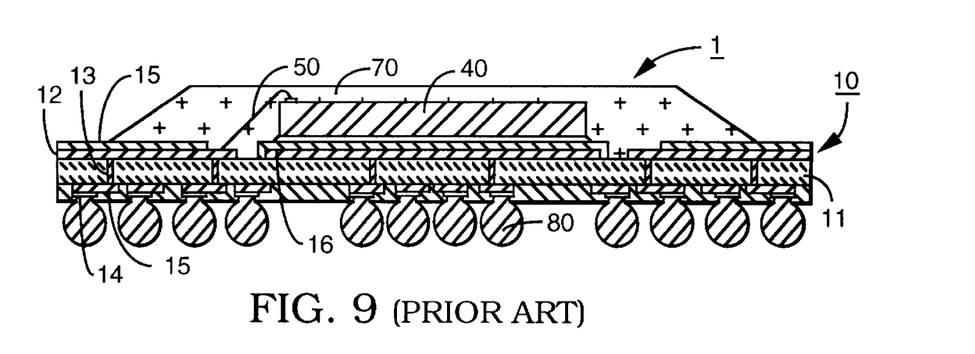
FIG. 9 is a sectional view through a typical BGA semiconductor package produced using the conventional PCB shown in FIGS. 8a and 8b.

FIGS. 8a and 8b are top and bottom plan views, respectively, of a conventional, strip-type multiple-package PCB 10 typically used in the manufacture of BGA semiconductor packages. FIG. 9 is a sectional view of a typical BGA semiconductor package incorporating such a conventional PCB.

As shown in the drawings, the typical PCB 10' comprises a dielectric substrate 11, typically made of a thermosetting resin, e.g., a bismaleimidetriazine or polyimide resin. A plurality of conductive traces 12 are formed on each side of the substrate to form predetermined circuit patterns on each side of the board. A plurality of die, or chip mounting plates 16 are centrally provided on the top surface of the substrate 11 for the mounting of semiconductor chips thereon. A plurality of conductive via holes 13 are formed through the substrate 11 to electrically connect the conductive traces 12 of both sides of the PCB with each other. A plurality of solder ball lands 14 are electrically connected to the conductive traces 12 on the bottom surface of the substrate.

As shown in FIG. 8a, a mold runner gate 17, comprising a thin, conductive metal plate or plating of, e.g., gold or palladium, extends from a corner of the substrate 11 to the chip mounting plate 16, and serves to guide molten molding compound, e.g., a resin, into the region of the chip mounting plate 16 during a package molding operation described in more detail below.

A non-conductive solder mask 15 coats both sides of the substrate 11 outside of selected areas of the conductive traces 12, e.g., around the edge of the chip mounting plate 16, and on the solder ball lands 14, and serves to electrically isolate the traces 12 from each other and to protect them from harmful environmental elements.

The mold runner gate 17 is electrically connected on the PCB 10' to a ground ring 25 formed about the periphery of the chip mounting plate 16 by means of a conductive ground trace 22. The grounded elements of a semiconductor chip (not shown in FIG. 8a), typically ground pads, are electrically connected to the ground ring 25 by means of bonding wires 50 (see FIG. 9) that extend between the chip and the ground ring. In the BGA package, ground signals are applied from the semiconductor chip to the mold runner gate 17, and the voltage drops occurring between the chip and ground can be easily and precisely measured. Likewise, any voltage drops occurring in the wire bonds between the chip and the conductive traces 12 can also be checked easily and precisely. The grounded mold runner gate/grounding ring arrangement therefore forms an effective common ground area for purposes of complete circuit definition within the BGA package.

As seen in FIGS. 8a and 8b, tooling holes 18 are used in the strip-shaped PCB 10 to position and fix the PCB in a package molding tool assembly. Singularizing holes 19 are used as reference points during singularization, or separation, of the individual BGA packages from the multiple-package PCB 10', which is typically accomplished by die cutting. The dotted square 19' defined by the singularizing holes 19 corresponds to the line along which the PCB is cut when the individual BGA packages are separated from the plurality of simultaneously fabricated packages on the PCB 10'.

Figure 10:
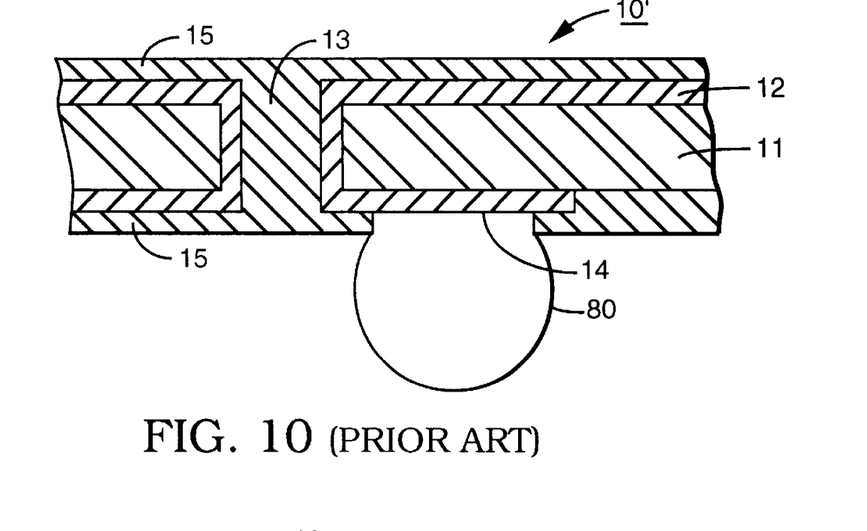
FIG. 10 is an enlarged, partial sectional view through the region around a typical via hole of the conventional PCB in FIG. 9.

FIG. 10 is a sectional view through the region around a via hole 13 of the PCB 10'. As shown in the drawing, the via holes 13 are formed between conductive traces 12 on opposite sides of the board to interconnect them through the board. The interior wall of the via hole 13 is plated with a conductive metal, while the solder mask 15 overlays the top surface of the trace 12 and fills the void in the via hole 13. A solder ball 80 is welded to the solder ball land 14 through an opening in the solder mask 15 and is used as an input/output terminal of the BGA package.

Figure 11:
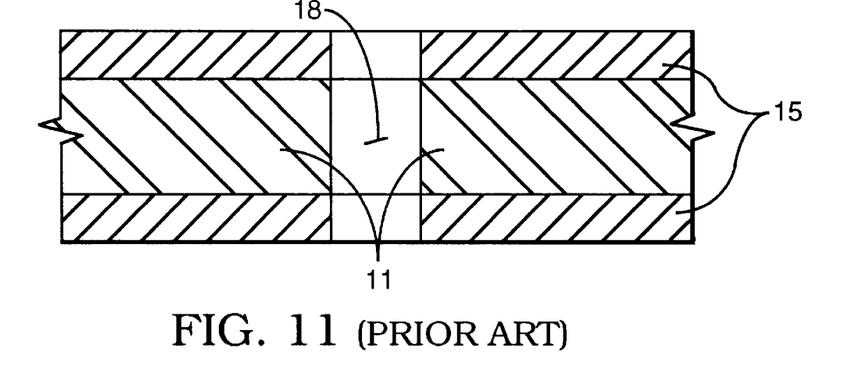
FIG. 11 is an enlarged, partial sectional view taken along the line E'—E' of FIG. 8b; and, FIG. 12 is a sectional view showing the PCB of FIGS. 8a and 8b being compressed and held between top and bottom molds during a BGA package molding process.
Figure 12:
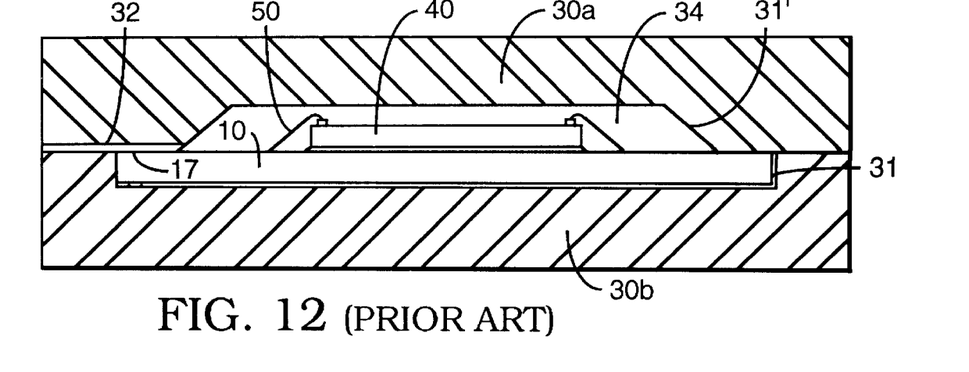

FIG. 11 is a sectional view through a tooling hole 18, as taken along the line E'—E' in FIG. 8b. FIG. 12 reveals that the tooling hole 18 is, like the via hole 13, formed through the thickness of the substrate 11 of the PCB. However, unlike the via hole 13, the tooling hole 18 does not include a conductive layer on its interior surface that electrically connects the upper and lower surfaces of the board, nor does the solder mask 15 fill the interior void of the hole.

A conventional BGA semiconductor package 1 that incorporates a conventional PCB 10' of the type described above is shown in elevational cross-section in FIG. 9. Typically, a plurality of such packages are simultaneously fabricated on the PCB 10' in the following manner: First, a plurality of semiconductor chips 40 are mounted, typically by means of a bonding layer (not shown), on the strip-shaped PCB 10', one on each of the chip mounting plates 16. Each chip 40 is then electrically connected to wire bonding areas on the conductive traces 12 (which are free of any solder masking 15) using a plurality of fine, conductive bonding wires 50.

After wire bonding is complete, a plurality of resin envelopes 70 are molded onto the upper surface of the PCB 10 around each of the chips 40 and its associated bonding wires 50 to individually encapsulate and protect them against damaging mechanical and electrical elements in their environment. After molding, a plurality of solder balls 80, which function as the input and/or output terminals of the packages 1, are respectively welded to the solder ball lands 14. The solder ball welding step is followed by a singularizing step in which the simultaneously formed plurality of BGA packages 1 of a reduced, uniform size, are separated from the PCB 10', typically by die cutting, into individual BGA packages 1 of the type illustrated in FIG. 9.

In the above manufacturing process, the molding procedure is carried out with the individual semiconductor chips 40 mounted on the PCB 10' and with the PCB clamped between top and bottom molds 30a and 30b, as shown in FIG. 12. The encapsulating resin reinforces the delicate wires 50 and bonds them securely to both the associated chip 40, the conductive traces 12, and the upper surface of the PCB' 10 in a sealed, monolithic block.

As seen in FIG. 12, the bottom mold 30b has a rectangular depression 31 in its top surface, which serves to seat the PCB 10' therein, while the top mold 30a is provided with a plurality of depressions 31' in its lower surface, each defining a cavity 34 over the PCB 10' having a configuration corresponding to the upper surface of the molded resin envelope 70 of each BGA package 1. A plurality of cavities 34 (FIG. 14) is thus defined by the lower depressions 31' of the top mold 30a and the top surface of the PCB 10, each of which encloses one of the semiconductor chips 40 and its associated bonding wires 50 positioned on the top surface of the PCB 10'.

Figure 5:
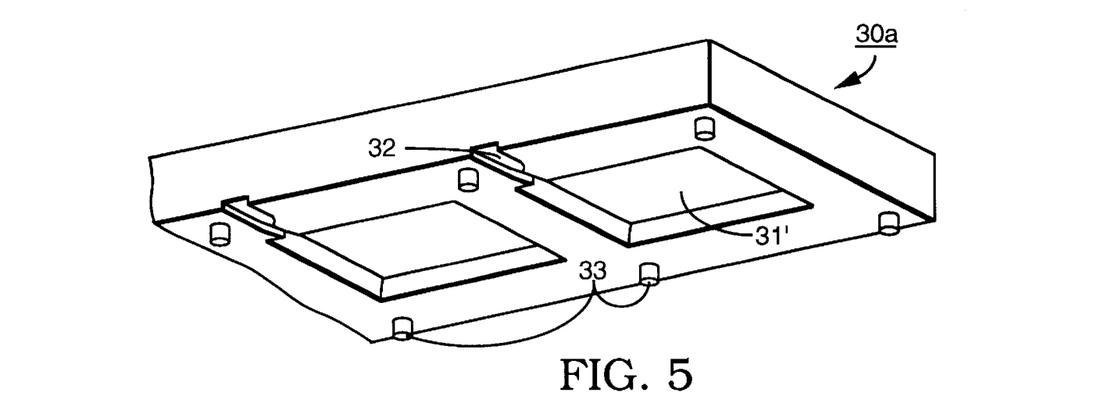
FIG. 5 is a partial, bottom perspective view of an exemplary top mold used in the process of molding the PCB of this invention.

As seen in the bottom perspective view of the top mold 30a in FIG. 5, a runner 32 is formed in the top mold 30a at a position near the corner of each cavity 34 to guide injected molten molding resin (not shown) into the cavity 34. The runners 32 are formed at positions corresponding to the positions of the respective mold runner gates 17 (see FIG. 8a) on the PCB 10'. The lower surface of the top mold 30a mates with the upper surface of the bottom mold 30b on opposite sides of the PCB 10' such that the runners 32 provide conduits between the top mold 34a and the PCB 10' for the introduction of the resin into the cavities 34.

The molding resin is injected under pressure into the cavity 34 through the runner 32, thereby forming a resin envelope 70 on the upper surface of the PCB 10 that completely encapsulates the chip 40 and its associated bonding wires 50.

The top mold 30a is provided with a plurality of tooling pins 33 that extend through the tooling holes 18 of the PCB 10' and into corresponding apertures (not shown) in the bottom mold 30b, thus locating and securely fixing the PCB 10' between the two molds during the molding process.

Importantly, it will be noted that, when the conventional PCB 10' is clamped between the top and bottom molds 30a, 30b during the molding procedure, all of the conductive surfaces on the PCB 10', e.g., the circuit traces 12 and the solder ball lands 14, are separated from the top and bottom molds 30a, 30b, respectively, by the thickness of the dielectric solder mask 15, i.e., the PCB is electrically isolated from both the top and bottom molds 30a, 30b, respectively, during the molding process.

During molding, hot molten molding resin under high pressure is injected into the cavity 34 through the conduit formed between the runner 32 in the top mold 30a and the mold runner gate 17 on the PCB 10, causing the molten resin to flow past the chip 40, the conductive bonding wires 50, and the surface of the PCB 10' with frictional contact. This frictional flow of the hot resin over these components generates static electricity, which is induced onto the chip 40, the wires 50 and the traces 12 of the PCB 10', thereby causing an undesirable accumulation of a strong electrostatic charge on these elements.

In those cases where the supply voltage specified for the semiconductor chips, or the allowable variation thereof, is relatively high, a rapid discharge of such an accumulated electrostatic charge will not necessarily cause any damage to the components of the BGA package. However, when the level of supply voltage specified for the semiconductor chips or allowable variation thereof is relatively low, then a rapid discharge of such an accumulated charge can cause permanent damage to the semiconductor chip 40, the bonding wires 50 and/or the conductive traces 12 of the BGA packages.

This undesirable discharge can occur when the packages 1 are removed from the molds after the molding process, or when they are brought into contact with other processing equipment during manufacture. When this discharge occurs, the electrical components of the semiconductor chip 40, the bonding wires 50, and/or the fine circuit traces 12 of the PCB itself can be irreparably burnt open. Therefore, the accumulation of an electrostatic charge on the components of a BGA package during package molding presents a potentially serious problem that must be overcome if BGA packages are to remain a viable semiconductor packaging candidate, especially in view of the recent trend toward chips that are smaller, higher capacity, and more highly integrated.

SUMMARY OF THE INVENTION

The present invention provides a PCB for ball grid array semiconductor packages which effectively prevents any accumulation of electrostatic charge on the components of the package during the molding process, thereby effectively preventing any damage to the semiconductor chips, bonding wires or conductive traces due to a rapid discharge of such an accumulated charge. To this end, the PCB of the present invention includes means for grounding the PCB to at least one of the two molds, which is itself grounded through the molding equipment used in the molding process, thus channeling any incipient charge generated during the molding process to ground, and thereby preventing the accumulation of any electrostatic charge on the components of the package.

A first embodiment of this invention comprises a flat grounding pad on the PCB which is electrically connected on the PCB to a ground via hole and/or a ground trace thereon. The grounding pad has a height equal to or slightly greater than the thickness of the solder mask, and is exposed through an opening in the solder mask to make electrical contact with at least one of the molds during the molding process.

A second embodiment of the invention comprises a raised grounding boss on the PCB which is electrically connected on the PCB to a ground via hole and/or a ground trace thereon. The grounding boss has a height equal to or slightly greater than the thickness of the solder mask, and is exposed through an opening in the solder mask to make electrical contact with at least one of the molds during the molding process.

In accordance with a third embodiment of the invention, the grounding means of the PCB comprises a grounding tooling hole formed in the PCB which is plated internally with a conductive metal layer, and which is electrically connected on the PCB to a ground via hole and/or a ground trace thereon. In this third embodiment, the grounding tooling hole of the PCB is grounded to a conductive metal tooling pin extending through it from at least one of the molds during the molding process.

BRIEF DESCRIPTION OF THE DRAWINGS

The above and other features and advantages of the present invention will be more readily understood from a consideration of the following detailed description of its preferred embodiments, particularly if taken in conjunction with the accompanying drawings, in which:

FIG. 4b is an enlarged view of the circled region "B" in FIG. 4a;

DETAILED DESCRIPTION OF THE PREFERRED EMBODIMENTS

This application is substantially similar to Korean Patent Application Nos.: 98-19304 (filed May 27, 1998); 98-36897 (filed Sep. 8, 1998); and, 98-36898 (filed Sep. 8, 1998), the disclosures of which are incorporated herein in their entireties by this reference.

Figure 1A:
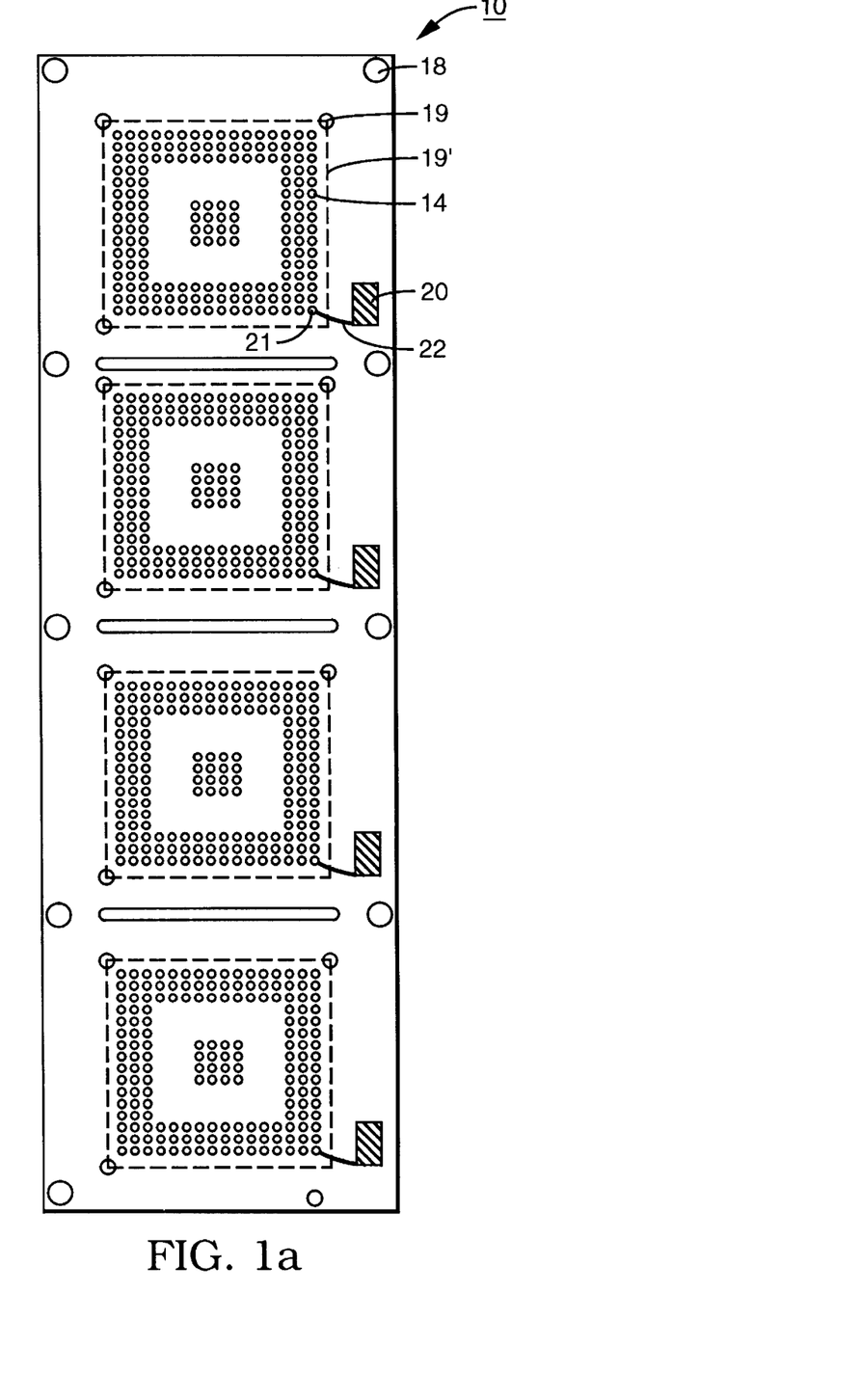
FIGS. 1a and 1b are bottom plan views of first and second embodiments, respectively, of a PCB for BGA semiconductor packages in accordance with the present invention.
Figure 1B:
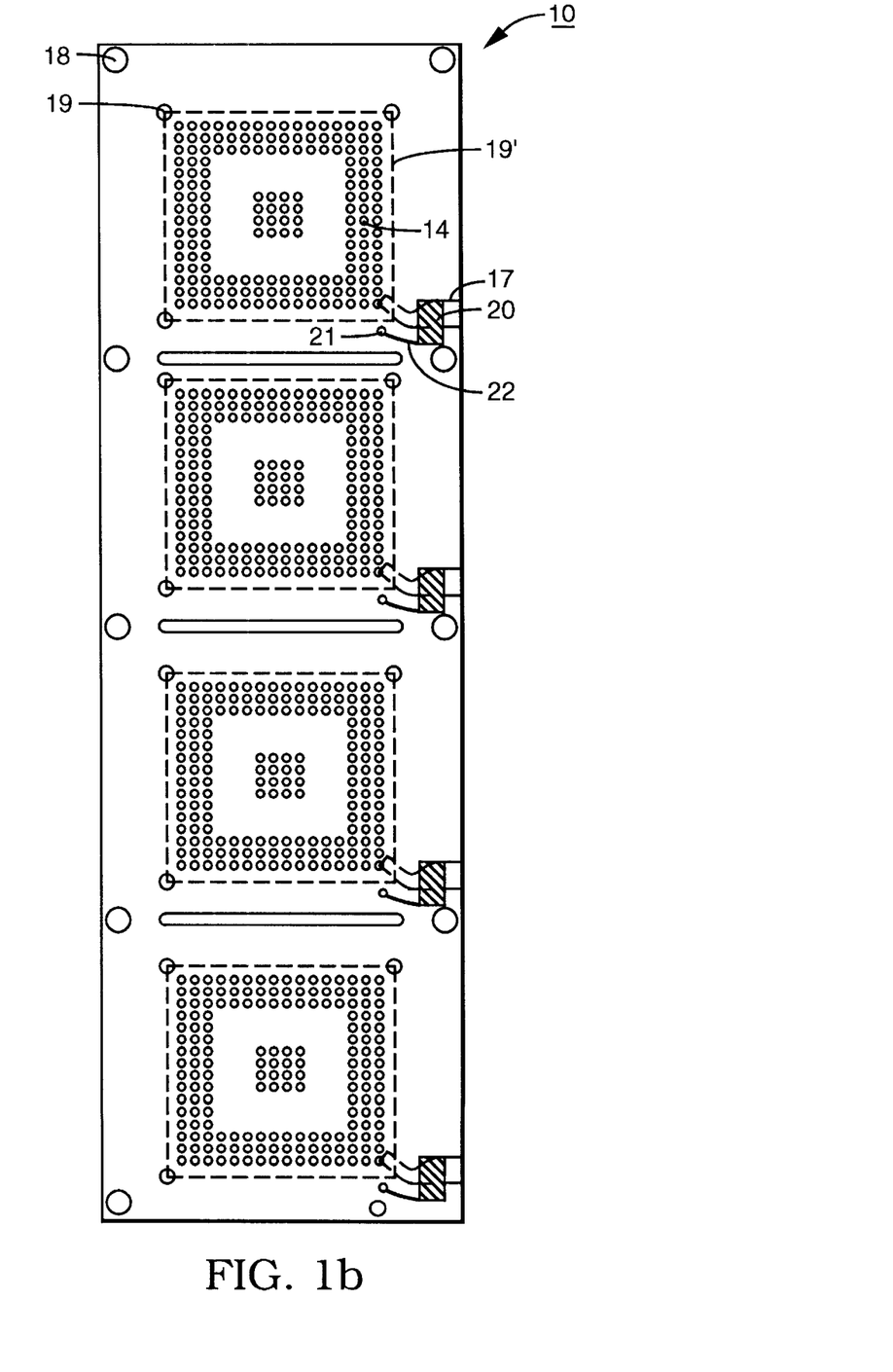

FIGS. 1a and 1b are bottom plan views of alternate first embodiments of a PCB 10 in accordance with this invention. The first embodiment comprises PCB 10 having a flat, rectangular grounding pad 20 (shown cross-hatched in the figures) on its bottom surface, which is used as a means for grounding the PCB 10 to the molding tool during the molding process. The configuration of the upper surface of the alternate PCBs 10 is substantially similar to that of the conventional PCB 10' illustrated in FIG. 8a. The difference between the two alternate first embodiments of the PCB in FIGS. 1a and 1b relates to the paths along which the grounding pads 20 are electrically connected to the mold runner gate 17 (shown dotted in FIG. 1b) on the other side of the PCB 10.

As in the conventional PCB 10', the mold runner gate 17, comprising a thin, conductive metal plate or plating of, e.g., gold or palladium, extends from a corner of the substrate 11 to the chip mounting plate 16, and serves to guide molten molding compound, e.g., a resin, into the region of the chip mounting plate 16 during package molding. The bonding strength between the material of the mold runner gate 17 and the molding resin is much lower than that between the resin and the solder mask 15, which enables the resin to be easily de-gated from the mold runner gate 17 without damaging the conductive traces 12 after molding is completed.

The PCB 10 of the first embodiment comprises a dielectric substrate 11 (see FIG. 2) having a plurality of conductive traces 12, including at least one ground trace 22, formed on opposite sides thereof. A plurality of chip mounting plates 16 (not shown) are centrally disposed on the top surface of the substrate at regular intervals for the mounting of semiconductor chips thereon. A plurality of conductive via holes, including at least one ground via hole 21, are formed on the substrate 11 to electrically connect the circuit patterns of opposite sides of the substrate 11 to each other. A plurality of solder ball lands 14 are electrically connected to the conductive traces 12 on the bottom surface of the substrate to provide attachment points for a plurality of solder balls (not shown). A non-conductive solder mask 15 is formed over the circuit patterns of both sides of the substrate 11 except at limited areas of the conductive traces 12 around the edge of each chip mounting plate 16, and on the solder ball lands 14. A plurality of singularization holes 19 are formed at the corners of each chip mounting plate 16, and a plurality of tooling holes 18 are formed at its edges for locating and fixing the PCB 10 in the molding tool.

In the first embodiment, the grounding pads 20 are formed on the bottom surface of the PCB 10 adjacent to each chip mounting plate 16 and, as more fully explained below, enable the PCB 10 to contact and be grounded to the bottom mold 30b during the molding process. The grounding pad 20 is electrically connected to both a ground via hole 21 and a ground trace 22, and through this common grounding feature, serves to prevent the accumulation of any electrostatic charge on the components during molding of the package.

In the first alternate of the first embodiment shown in FIG. 1a, each of the grounding pads 20 is electrically connected from the bottom surface to the top surface of the PCB 10 through a ground trace 22 and a ground via hole 21 that lies inside of the singularization line 19', thus ensuring a complete grounding of both surfaces of the PCB 10. On the upper surface of the PCB, the ground trace 22 is electrically connected to both the ground via hole 21 on the PCB 10, and to a ground bonding pad of a semiconductor chip (not shown) mounted on each of the chip mounting plates 16 by means of a ground bonding wires (not shown) that extend between the chip and the PCB.

In the second alternate of the first embodiment shown in FIG. 1b, the grounding pad 20 is electrically connected to the mold runner gate 17 on the upper surface of the PCB by means of a ground via hole 21 which, unlike the ground via hole 21 in the first alternate of FIG. 1a, lies outside of the singularization line 19'.

It is preferable, as shown in the alternate first embodiments shown in FIGS. 1a and 1b, that the grounding pads 20 be formed at positions outside of the cutting lines 19', which result in their being separated from the finished individual BGA packages when they are singularized from the PCB 10. However, it should be understood that the grounding pads 20 may alternatively remain on the individual BGA PCBs after singularization by simply forming them inside of the cutting lines 19', should that be desirable.

Figure 2:
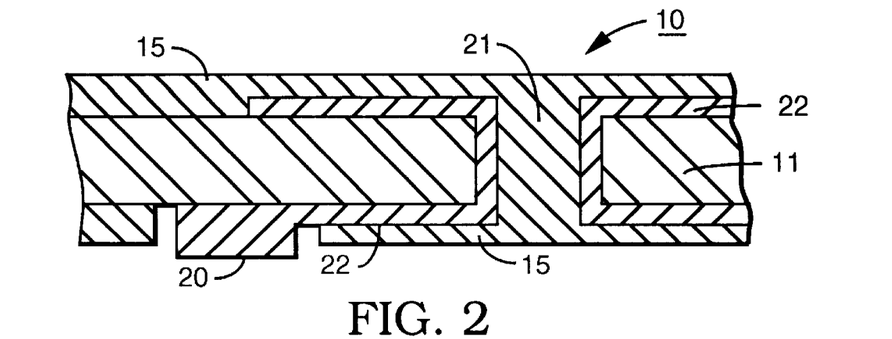
FIG. 2 is an enlarged, partial sectional view of a flat grounding pad formed on the PCB of FIG. 1a or 1b.

The enlarged sectional view of the grounding pad 20 in FIG. 2 shows that each of the grounding pads 20 is exposed through an opening in, and preferably raised slightly above, the non-conductive solder mask 15 surrounding the pads 20, so that the pads make a reliable electrical contact with the bottom mold (not shown), and thereby ground the PCB 10 to the mold during the molding operation. However, the grounding pads 20 may also be formed at the same height as the solder mask 15 without adversely affecting their function. This is because the resin solder mask 15 is more compressible than the metal grounding pads 20, and hence, when the PCB 10 is forcefully compressed between the top and bottom molds during molding, the solder mask 15 will compress slightly, and permit the grounding pads 20 to make a reliable electrical contact with the bottom mold.

Figure 3A:
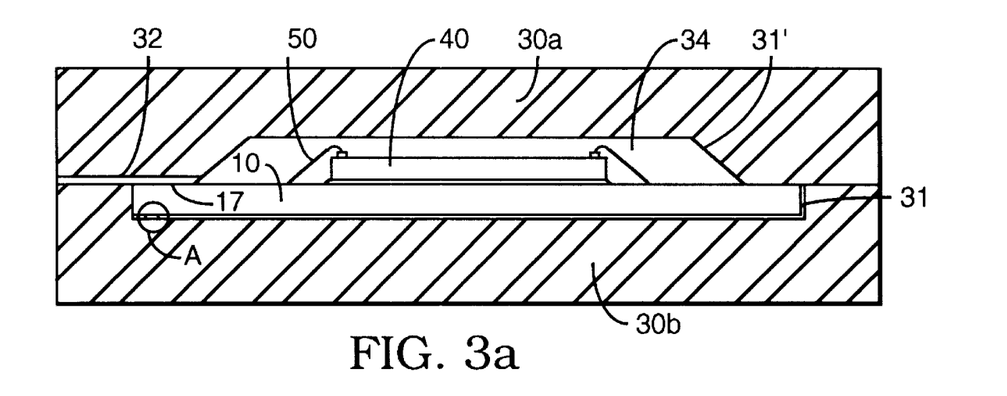
FIG. 3a is a sectional view showing the PCB of FIG. 1a or 1b being compressed and held between top and bottom molds during a BGA package molding process.
Figure 3B:
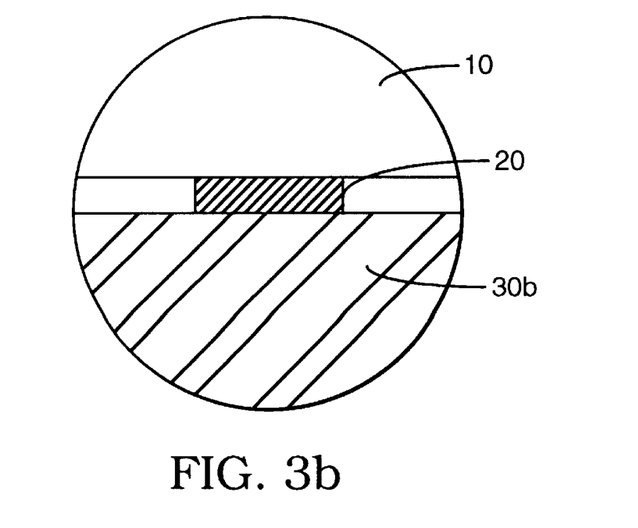
FIG. 3b is an enlarged view of the circled region "A" in FIG. 3a, showing a grounding pad on the PCB in FIG. 3 making electrical contact with the bottom mold during the molding process.

FIG. 3a shows the PCB 10 of FIGS. 1a and 1b being compressed between the top and bottom molds 30a and 30b during package molding. FIG. 3b is an enlarged view of the circled region "A" of FIG. 3a, and shows a grounding pad 20 on the bottom of the PCB 10 in electrical contact with the bottom mold 30b during the molding process. As shown in these figures, the PCB 10 of the first embodiment is positively and reliably grounded to the bottom mold 30b by the grounding pad 20 by simply positioning the PCB 10 in the upper depression 31 of the bottom mold 30b and compressing it with the upper mold 30a during the molding process.

In FIGS. 3a and 3b, the grounding pads 20 are shown formed on the bottom surface of the PCB 10. However, it is altogether possible when desirable to form the grounding pads 20 on an edge of the PCB 10, and/or at appropriate locations (i.e., outside of the encapsulation areas) on the top surface of the PCB 10, without adversely affecting the function of this first embodiment of the invention.

Figure 4A:
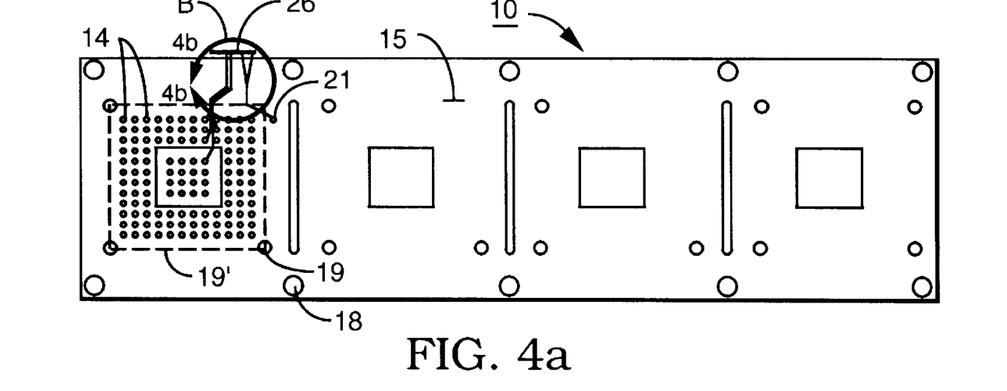
FIG. 4a is a bottom view of a PCB for BGA semiconductor packages in accordance with the second embodiment of the present invention.
Figure 4B:
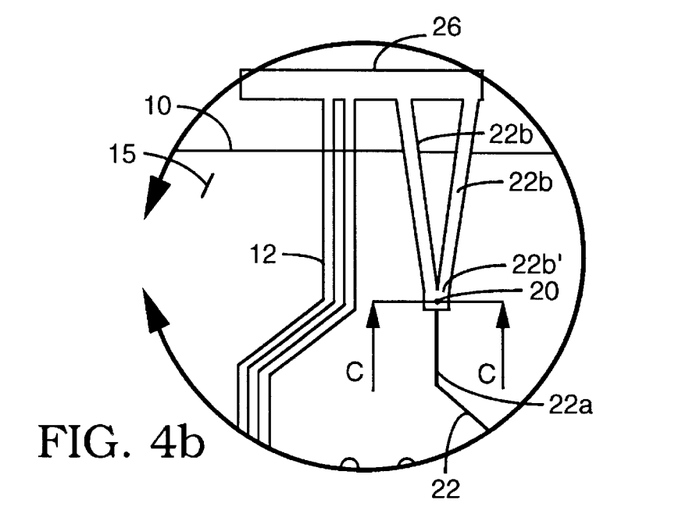
Figure 4C:
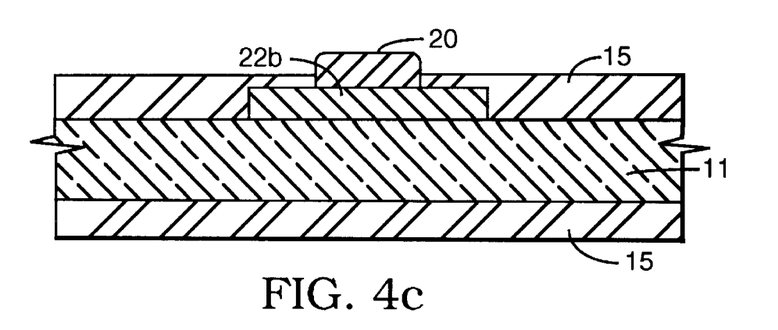
FIG. 4c is an enlarged, partial sectional view taken along the line C—C of FIG. 4b.

FIG. 4a is a bottom plan view of a PCB 10 used in the second preferred embodiment of the method of the present invention. An enlargement of the circled region "B" of FIG. 4a is shown in FIG. 4b. FIG. 4c is a sectional view taken along the line C—C in FIG. 6b. In the second embodiment in FIG. 4a, the configuration of the PCB 10 is generally the same as that described above in connection with the first embodiment illustrated in FIGS. 1a and 1b. Accordingly, the following description focuses on the difference between the two embodiments.

In FIG. 4a, a plating current bus 26 is shown schematically as a dark line, or bar. A current bus 26 such as the one illustrated is typically positioned between adjacent patterns of simultaneously fabricated square or rectangular raw PCBs which are eventually cut into a plurality of strip-type PCBs 10 after fabrication is complete. During fabrication, a variety of conductive metals, such as copper, tin, and/or gold, or alloys thereof, are typically plated onto the PCBs using the current bus 26 as a means for applying the plating current. It will be understood that the current bus 26, along with the portion of the underlying main board substrate, is separated from the individual strip-type PCBs 10 and discarded after they have been severed from the main board. However, in FIGS. 4a and 4b, the plating current bus 26 is shown as if it were still attached to the PCB 10 for purposes of description of the second embodiment of this invention.

Importantly, it should be noted that, in the second embodiment, the conductive traces 12, the ground traces 22, 22a and 22b, the conductive via holes 14, and the ground via holes 21 are all commonly connected to the plating current bus line 26, for fabrication purposes that are explained in more detail below.

As shown in FIG. 4c, the means for grounding the PCB 10 during molding according to the second embodiment comprise a raised grounding boss 20. The grounding boss 20 is formed by plating a relatively thick layer of a conductive metal, such as gold, on the ground trace 22b provided on the top surface of the PCB 10. The grounding boss 20 is exposed through an opening in the solder mask 15, and is designed to have a height not less than the thickness of the solder mask 15. To enable the grounding boss 20 to reliably contact at least one of the molds during package molding, the grounding boss 20 is preferably formed to be slightly higher than the thickness of the solder mask 15. The grounding bosses 20 are also preferably formed at positions adjacent to the mold runner gates (not shown), as this makes it easier to electrically connect the bosses to the mold runner gates on the PCB, and enables the design of the PCB 10 to more closely approximate that of a conventional PCB.

As in the case of the grounding pads 20 of the first embodiment, the height of the grounding bosses 20 of the second embodiment is not critical, provided that they positively and reliably contact at least one of the top and bottom molds 30a and 30b when the PCB 10 is clamped between the two molds during the molding operation, and that they do so without damaging the PCB 10.

Also as with the first embodiment, the individual BGA packages are preferably separated from the strip-type PCB 10 free of any grounding bosses 20 by forming the bosses at locations on the PCB 10 outside of the cutting lines 19'. However, it should be understood that the grounding bosses 20 can also be designed to remain in the singularized BGA packages by forming them at locations inside of the package cutting lines 19', if desired. Briefly, the position of the grounding bosses 20 may be varied within reason without adversely affecting their function, provided that they effectively ground the PCB 10 to at least one of the molds during package molding, and thereby prevent an accumulation of any electrostatic charge on the semiconductor chips, the bonding wires, and/or the conductive traces of the PCB 10 during molding.

The fabrication of an exemplary PCB 10 having the grounding bosses 20 of the second embodiment is now discussed with reference to FIG. 4b. The ground traces 22, 22a and 22b extend from the ground via hole 21 before connecting to the current bus 26. The two ground traces 22b, which are connected directly to the current bus 26, are arranged in a V-shaped configuration that converge at a junction 22b'. One end of the ground trace 22a is connected to the junction 22b', while the other end of the ground trace 22a connects to an end of the ground trace 22. The ground trace 22 is connected at its other end to the ground via hole 21.

The ground via hole 21 may be electrically connected to a mold gate runner 17 (not seen in FIGS. 4a, 4b) on the top surface of the PCB 10 in the same mariner as described for the second alternate of the first embodiment of FIG. 1b. The mold gate runner 17 is, as previously described, electrically connected to the chip ground ring 25 (see FIG. a), which, as previously described, is electrically connected to the ground pad of a semiconductor chip by means of a plurality of bonding wires. The connection between the mold gate runner 17 and the ground ring 25 is implemented in the same manner as described for the conventional PCB 10'.

The ground traces 22, 22a and 22b of the PCB 10 are coated with the solder mask 15 in the same manner as that described for the circuit pattern formed by conventional PCB conductive traces 12. Importantly, however, it should be understood that the solder mask 15 includes openings over each junction 22b' of the V-shaped ground traces 22b, so that the junctions are exposed through the solder mask 15. The grounding bosses 20 are formed on the PCB 10 in the openings in the solder mask 15 at the junctions 22'.

Each of the V-shaped ground traces 22b is configured to be narrower and/or thinner than the current bus 26, while the middle ground trace 22a, connected to the junction 22b' of the ground traces 22b, is configured to be narrower and/or thinner than each of the ground traces 22b. This configuration causes a plating current of high density to flow through the middle ground trace 22a during the plating process, which, in a single plating operation, quickly and reliably plates a relatively thick metal grounding boss 20 onto the junction 22b' that is higher than the solder mask 15, as shown in FIG. 4c.

In the first and second embodiments described above, the grounding parts 20 are illustrated and described as rectangular, circular or cylindrical in configuration. However, those skilled in the art will recognize that the grounding pads or bosses 20 are not limited to these particular configurations, but rather, may be designed to have other configurations where desirable. Further, the position, area and height of these grounding parts 20 may be varied within reason without adversely affecting their function, provided only that they positively and reliably ground the PCB 10 to at least one of the molds during the molding operation, and do so without damaging the PCB when it is compressed between the molding tools.

FIG. 5 is a partially broken-away bottom perspective view of an exemplary top mold 30a used in the molding of the PCB 10 of this invention. The following description is made with reference to FIGS. 5 and 3a.

As shown in FIG. 5, the top mold 30a has a plurality of depressions 31' in its lower surface. Each depression 31' has a configuration corresponding to the upper surface of the resin envelope 70 of each BGA package, and defines a cavity 34 with the upper surface of the PCB 10. A runner 32 is provided at one corner of each of the above depressions 31, which communicates between the outside of the mold 30a and the cavity 34, and serves as a conduit to guide the melted resin into the cavity 34 of the mold 30a. Each runner 32 is connected at the exterior of the mold 30a to a resin injection port (not shown).

The top mold 30a is provided with a plurality of conductive tooling pins 33. The tooling pins 33 extend through the tooling holes 18 of the PCB 10 and into mating apertures (not shown) in the bottom mold 30b, and serve to locate and fix the PCB 10 between the two molds during the molding process. As described in more detail below, this arrangement affords another effective means for grounding the PCB 10 to the molds during the molding operation.

Figure 6:
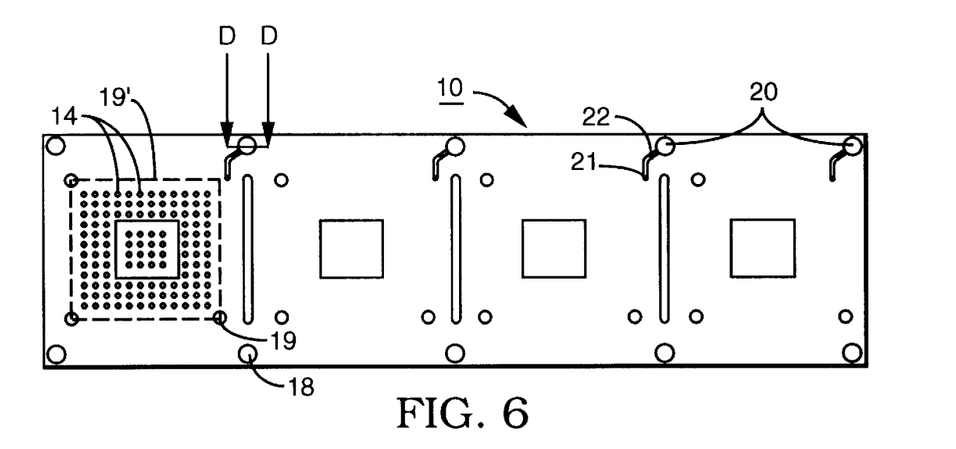
FIG. 6 is a bottom plan view of a PCB for BGA semiconductor packages in accordance with the third embodiment of this invention.
Figure 7:
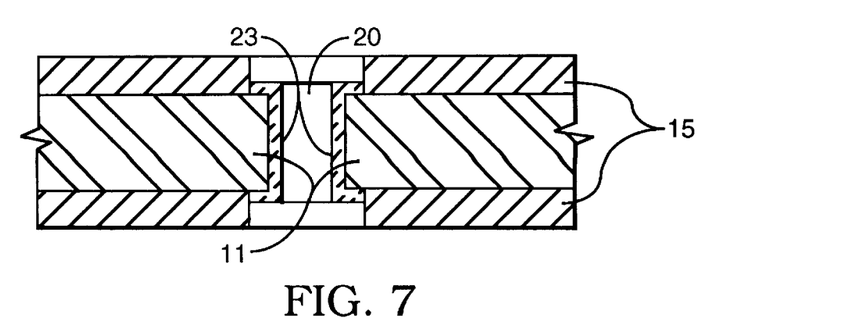
FIG. 7 is an enlarged, partial sectional view of the PCB taken along the line D—D in FIG. 6.

FIG. 6 is a bottom plan view of a PCB 10 in accordance with a third embodiment of this invention. FIG. 7 is a sectional view of the PCB 10 taken along the line D—D in FIG. 6. In the third embodiment, the interior walls of the tooling holes 18 are plated with a conductive metal to provide a means 20 for grounding the PCB 10 during package molding. The overall configuration of the PCB 10 in the third embodiment shown in FIGS. 6 and 7 is generally the same as that in the first two embodiments described above, with the differences described below.

As shown in FIG. 6, the position and construction of the ground via holes 21 are also generally the same as that described for the other embodiments of this invention. The ground via holes 21 may be connected to the mold runner gate (not seen in FIG. 6), and the solder masks 15 are formed on the PCB in the same manner as that described for the other embodiments. One end of each ground trace 22 is electrically connected to an associated ground via hole 21, while the other end of the trace 22 is electrically connected to an associated tooling hole 18 which is used as the grounding means 20 of the PCB 10.

Referring to FIG. 7, the inside wall of each of the tooling holes 18 is plated with a thin, conductive layer 23 of, e.g., copper, having a predetermined thickness. When the conductive metal tooling pins 33 of the top mold 30a are inserted into the tooling holes 18 of the PCB 10 during the molding process, the tooling pins 33 make positive, reliable contact with the conductive layers 23 of the tooling holes 18 and ground the PCB 10 to at least the top mold 30a.

The conductive layers 23 in the tooling holes 18 are preferably formed by at least one of two well-known processes: electroless plating and electrolytic plating. In either case, it is necessary to control the thickness of the layers 23 such that they are not, on the one hand, so thick as to prevent a smooth insertion of the tooling pins 33 into the tooling holes 18, and on the other, so thin that the tooling pins 33 fail to reliably contact the layers, and hence, fail to ground the PCB to the mold. Thus, it is important to control the thickness of the layers 23 such that the tooling pins 33 insert smoothly into the tooling holes 18 and make a reliable electrical contact with the conductive layers 23. In the embodiment of FIGS. 6 and 7, the inside walls of the tooling holes 18 are plated with layers 23 of copper. However, the conductive metal of the layers 23 is not limited to copper, but may also be selected from other conductive metals, such as tin, gold, or silver, or alloys thereof, without adversely affecting their function.

As skilled practitioners will by now understand, the present invention provides a PCB for use in BGA semiconductor packages that effectively prevents the accumulation of an electrostatic charge on the components of the package generated by the flow of hot, pressurized molten resin over the components during the package molding operation. Means are provided for grounding the PCB to at least one of the top and bottom molds so that any such incipient charge is quickly conducted away to ground. The molding method thereby effectively prevents any damage to the semiconductor chips, bonding wires or conductive traces of the packages that could result from a rapid discharge of such an accumulated charge.

Although specific preferred embodiments of the present invention have been described and illustrated for purposes of its explication, those skilled in the art will appreciate that various modifications, additions and substitutions to these embodiments are possible, depending on the particular problem at hand, without departing from the scope and spirit of the invention, as defined by the accompanying claims.

What is claimed is:

1. A printed circuit board (PCB) for a ball grid array (BGA) semiconductor package, comprising:

a dielectric substrate having top and bottom surfaces;

a conductive circuit pattern formed on the top and bottom surfaces of the substrate, each circuit pattern comprising a plurality of conductive traces, at least one of the traces comprising a ground trace;

a chip mounting plate centrally disposed on the top surface of the substrate for mounting a semiconductor chip thereon;

a plurality of conductive via holes formed in the substrate and electrically connecting selected ones of the circuit patterns on the top and bottom surfaces of the substrate to each other;

a solder mask formed over each of the circuit patterns on the top and bottom surfaces of the substrate, the mask electrically isolating the conductive traces from each other and from the environment;

a plurality of simulation holes formed on the PCB at positions around the circuit patterns, the holes defining a package separation line on the substrate; and, grounding means formed on the substrate and electrically connected to the ground trace, the grounding means making electrical contact with at least one grounded mold during molding of the package, and being positioned outside of the separation line such that the grounding means is separated from the package when the package is separated from the substrate.

2. The PCB according to claim 1, wherein the solder mask has an opening on a surface of the PCB opposite to the chip mounting plate surface, and wherein the grounding means comprises a conductive grounding pad positioned within the opening.

3. The PCB according to claim 1, wherein the solder mask includes an opening at an edge of the PCB, and wherein the grounding means is positioned within the opening.

4. The PCB according to claim 1, wherein the grounding means has a height equal to or greater than the thickness of either of the solder masks.

5. The PCB according to claim 1, wherein the substrate has a tooling hole at an edge thereof, the hole being adapted to receive a metal tooling pin extending from a mold, and wherein the grounding means comprises a conductive layer plated on the interior surface of the tooling hole, the conductive layer being electrically connected to the ground trace on the PCB and in electrical contact with the tooling pin during molding of the package.

6. The PCB according to claim 1, wherein the ground trace comprises a first, V-shaped trace that diverges from a junction point on the PCB, and a second, middle trace that is narrower and/or thinner than the V-shaped trace, the second trace having a first end electrically connected to the junction of the V-shaped trace and a second end connected to a ground via hole, and wherein the grounding means comprises a raised grounding boss plated on the junction of the V-shaped ground trace, the grounding boss being outwardly exposed through an opening in the solder mask.

7. The PCB according to claim 1, further comprising a conductive metal layer plated on the grounding means.

8. The PCB according to claim 1, wherein the conductive via holes include at least one ground via hole electrically connected to the ground trace.

9. The PCB according to claim 2, further comprising a conductive mold runner gate formed at a corner of the substrate and electrically connected to the grounding means through at least one of the ground via hole and the ground trace.

10. The PCB according to claim 8, wherein the solder mask on a surface of the PCB opposite to the chip mounting plate has an opening therein, and wherein the grounding means comprises a boss positioned within the opening.

11. An improved PCB for a BGA semiconductor package of a type that includes a PCB having a solder mask overlying a conductive circuit pattern thereon and an envelope of resin formed thereon by compressing the PCB between two grounded molds and injecting hot, molten resin under pressure into a cavity in the molds, and from which the package is separated by cutting the PCB along a separation line surrounding the envelope, the improvement comprising:

means on the PCB and outside of the separation line for electrically connecting the conductive traces to at least one of the molds during injection of the resin into the cavity.

12. The PCB according to claim 11, further comprising a conductive metal layer plated on the grounding means.

13. The PCB of claim 11, wherein the means for electrically connecting the conductive traces to at least one of the molds comprises:

at least one ground feature on the PCB; and, means electrically connected to the at least one ground feature for making electrical contact with at least one of the molds when the PCB is compressed between the molds.

14. The PCB of claim 13, wherein the at least one ground feature comprises a ground trace.

15. The PCB of claim 13, wherein the at least one ground feature comprises a ground via hole.

16. The PCB of claim 13, wherein the at least one ground feature comprises a conductive mold runner gate.

17. The PCB of claim 13, wherein the means for making electrical contact with at least one of the molds comprises a flat, conductive pad which is connected to the at least one ground feature on the PCB and which contacts at least one of the molds when the PCB is compressed between the molds.

18. The PCB of claim 13, wherein the means for making electrical contact with at least one of the molds comprises a raised, conductive boss which is connected to the at least one ground feature and which contacts at least one of the molds when the PCB is compressed between the molds.

19. The PCB of claim 13, wherein the PCB includes a tooling hole at an edge thereof, the hole being adapted to receive a metal tooling pin extending from one of the molds, and wherein the means for making electrical contact with at least one of the molds comprises a conductive layer plated on the interior surface of the tooling hole, the conductive layer being connected to the at least one ground feature and in contact with the tooling pin when the PCB is compressed between the molds.

* * * * *

UNITED STATES PATENT AND TRADEMARK OFFICE
CERTIFICATE OF CORRECTION

PATENT NO.   : 6,246,015 B1
DATED        : June 12, 2001
INVENTOR(S)  : Kim, Sung Jin It is certified that error appears in the above-identified patent and that said Letters Patent is hereby corrected as shown below:

Column 11,
Line 18, delete "simulation" insert -- singulation --

Signed and Sealed this

Eleventh Day of February, 2003

JAMES E. ROGAN
*Director of the United States Patent and Trademark Office*